(12) United States Patent
Zhu et al.

(10) Patent No.: US 12,368,530 B2
(45) Date of Patent: Jul. 22, 2025

(54) ENHANCED DECODING FOR POLARIZATION CODE

(71) Applicant: Nokia Technologies Oy, Espoo (FI)

(72) Inventors: Kai Zhu, Shanghai (CN); Yu Chen, Shanghai (CN)

(73) Assignee: Nokia Technologies Oy, Espoo (FI)

( * ) Notice: Subject to any disclaimer, the term of this patent is extended or adjusted under 35 U.S.C. 154(b) by 222 days.

(21) Appl. No.: 17/908,983

(22) PCT Filed: Mar. 5, 2020

(86) PCT No.: PCT/CN2020/077977
§ 371 (c)(1),
(2) Date: Sep. 2, 2022

(87) PCT Pub. No.: WO2021/174484
PCT Pub. Date: Sep. 10, 2021

(65) Prior Publication Data
US 2023/0163877 A1 May 25, 2023

(51) Int. Cl.
*H04L 1/00* (2006.01)
*H03M 13/13* (2006.01)

(52) U.S. Cl.
CPC .......... *H04L 1/0054* (2013.01); *H03M 13/13* (2013.01); *H04L 1/0057* (2013.01); *H04L 1/0061* (2013.01)

(58) Field of Classification Search
CPC ... H04L 1/0054; H04L 1/0057; H04L 1/0061; H03M 13/13

(Continued)

(56) References Cited

U.S. PATENT DOCUMENTS

| 2013/0253912 A1* | 9/2013 | Medlock ............... G06F 40/205 704/9 |
| 2018/0013868 A1 | 1/2018 | Lin et al. |

(Continued)

FOREIGN PATENT DOCUMENTS

| CN | 108702290 A | 10/2018 |
| CN | 110546902 A | 12/2019 |

(Continued)

OTHER PUBLICATIONS

Arikan, "Channel Polarization: A Method for Constructing Capacity-Achieving Codes for Symmetric Binary-Input Memoryless Channels", IEEE Transactions on Information Theory, vol. 55, No. 07, Jul. 2009, pp. 3051-3073.

(Continued)

*Primary Examiner* — Gbemileke J Onamuti
(74) *Attorney, Agent, or Firm* — Nokia Technologies Oy

(57) ABSTRACT

Example embodiments of the present disclosure relate to devices, methods, apparatuses and computer readable storage media of enhanced decoding for polarization code. The method includes determining a likelihood sequence associated with a signal sequence received from a second device via a communication channel between the second device and the first device; generating a set of candidate sequences of the signal by processing the likelihood sequence with a first operation; determining a reference sequence by processing the likelihood sequence with a second operation different from the first operation; and determining a target sequence of the signal from the set of candidate sequences at least partially based on the reference sequence. In this way, the decoding at receiver side can be enhanced to less rely on CRC during decoding. This could dramatically improve the overall performance of the channel.

17 Claims, 7 Drawing Sheets

(58) Field of Classification Search
USPC .......................................................... 370/310
See application file for complete search history.

(56) References Cited

U.S. PATENT DOCUMENTS

| | | | |
|---|---|---|---|
| 2018/0083655 | A1 | 3/2018 | El-Khamy et al. |
| 2019/0097756 | A1 | 3/2019 | Chatterjee et al. |
| 2019/0165818 | A1 | 5/2019 | Miyazaki |
| 2020/0067639 | A1* | 2/2020 | Lin ........................ H04L 1/0045 |

FOREIGN PATENT DOCUMENTS

| | | | |
|---|---|---|---|
| CN | 110582958 | A | 12/2019 |
| JP | 2005033705 | A | 2/2005 |
| JP | 2008148056 | A | 6/2008 |
| JP | 2019102950 | A | 6/2019 |
| WO | WO-2004068491 | A1 | 5/2006 |
| WO | WO 2017/215486 | A1 | 12/2017 |
| WO | WO 2018/192514 | A1 | 10/2018 |
| WO | 2018/201753 | A1 | 11/2018 |
| WO | 2018/207155 | A1 | 11/2018 |
| WO | WO-2018214101 | A1 | 11/2018 |
| WO | 2019/133039 | A1 | 7/2019 |

OTHER PUBLICATIONS

Tal et al., "List Decoding of Polar Codes", IEEE Transactions on Information Theory, vol. 61, No. 05, May 2015, pp. 2213-2226.

Chen et al., "List successive cancellation decoding of polar codes", Electronics Letters, vol. 48, No. 09, Apr. 26, 2012, 1 page.

Balatsoukas-Stimming et al., "LLR-Based Successive Cancellation List Decoding of Polar Codes", IEEE Transactions on Signal Processing, vol. 63, No. 19, Oct. 1, 2015, pp. 5165-5179.

Chen et al., "Belief Propagation Decoding of Polar Codes using Intelligent Post-Processing", Journal of Signal Processing Systems, vol. 92, Mar. 27, 2020, pp. 487-497.

Hashemi et al., "On the Performance of Polar Codes for 5G eMBB Control Channel", 51st Asilomar Conference on Signals, Systems, and Computers, Oct. 29-Nov. 1, 2017, pp. 1764-1768.

Zhan et al., "Channel Coding for High Performance Wireless Control in Critical Applications: Survey and Analysis", IEEE Access, vol. 06, May 31, 2018, pp. 29648-29664.

Fazeli et al., "Viterbi-Aided Successive-Cancellation Decoding of Polar Codes", IEEE Global Communications Conference (Globecom), Dec. 4-8, 2017, 6 pages.

Decision of Final Rejection received for corresponding Japanese Patent Application No. 2022-553122, dated Jun. 11, 2024, 1 page of office action and No. page of translation available.

Sharp, "Initial access procedure for NR-U", 3GPP TSG RAN WG1 #97, R1-1907213, May 13-17, 2019, Reno, USA.

Office action received for corresponding Chinese Patent Application No. 202080100606.6, dated Aug. 31, 2024, 7 pages of office action and 7 pages of office action translation available.

Office action received for corresponding Chinese Patent Application No. 202080100606.6, dated Jan. 26, 2025, 6 pages of office action and 11 pages of office action translation/summary available.

Office action received for corresponding Chinese Patent Application No. 202080100606.6, dated Apr. 18, 2025, 6 pages of office action and 16 pages of office action translation/summary available.

* cited by examiner

ENHANCED DECODING FOR POLARIZATION CODE

CROSS REFERENCE TO RELATED APPLICATION

This patent application is a U.S. National Stage application of International Patent Application Number PCT/CN2020/077977 filed Mar. 5, 2020, which is hereby incorporated by reference in its entirety.

FIELD

Embodiments of the present disclosure generally relate to the field of telecommunication and in particular, to devices, methods, devices and computer readable storage media of enhanced decoding for polarization code.

BACKGROUND

Deploying hyper reliable and hyper secure communication in smart factory is more challenging than terrestrial cellular network owing to environmental electromagnetic interference generated by all kinds of machinery. Recently, it has confirmed that, strong interference is observed in the frequency band where Macro Base Station (BS) generally operates at. Such interference is emitted from Spot and Arc welding equipment, which is very common in automobile and many other automations factories.

Moreover, in typical industrial scenarios, electromagnetic radiation from switching on/off of high-power/high-voltage appliances may also cause strong burst interference leading to frequent interruption/outage in the data transmission, similar to the case where wireless channel suffers from deep fading. Such outage greatly limits the overall system throughput and tampers reliable communication, which is not affordable in hyper critical networks. Hence, for hyper critical networks, the physical layer data processing chain design needs imperative enhancement.

In Release 15 standard specification, it has been agreed that Reed Muller (RM) code and Polar code are used in 5G NR to protect uplink and downlink control signaling at physical layer.

SUMMARY

In general, example embodiments of the present disclosure provide a solution of enhanced decoding for polarization code.

In a first aspect, there is provided a first device. The first device comprises at least one processor; and at least one memory including computer program codes; the at least one memory and the computer program codes are configured to, with the at least one processor, cause the first device at least to determine a likelihood sequence associated with a signal sequence received from a second device via a communication channel between the second device and the first device; generate a set of candidate sequences of the signal by processing the likelihood sequence with a first operation; determine a reference sequence by processing the likelihood sequence with a second operation different from the first operation; and determine a target sequence of the signal from the set of candidate sequences at least partially based on the reference sequence.

In a second aspect, there is provided a method. The method comprises determining a likelihood sequence associated with a signal sequence received from a second device via a communication channel between the second device and the first device; generating a set of candidate sequences of the signal by processing the likelihood sequence with a first operation; determining a reference sequence by processing the likelihood sequence with a second operation different from the first operation; and determining a target sequence of the signal from the set of candidate sequences at least partially based on the reference sequence.

In a third aspect, there is provided an apparatus comprises means for determining a likelihood sequence associated with a signal sequence received from a second device via a communication channel between the second device and the first device; means for generating a set of candidate sequences of the signal by processing the likelihood sequence with a first operation; means for determining a reference sequence by processing the likelihood sequence with a second operation different from the first operation; and means for determining a target sequence of the signal from the set of candidate sequences at least partially based on the reference sequence.

In a fourth aspect, there is provided a computer readable medium having a computer program stored thereon which, when executed by at least one processor of a device, causes the device to carry out the method according to the second aspect.

Other features and advantages of the embodiments of the present disclosure will also be apparent from the following description of specific embodiments when read in conjunction with the accompanying drawings, which illustrate, by way of example, the principles of embodiments of the disclosure.

BRIEF DESCRIPTION OF THE DRAWINGS

Embodiments of the disclosure are presented in the sense of examples and their advantages are explained in greater detail below, with reference to the accompanying drawings, where.

Throughout the drawings, the same or similar reference numerals represent the same or similar element.

DETAILED DESCRIPTION

Figure 1:
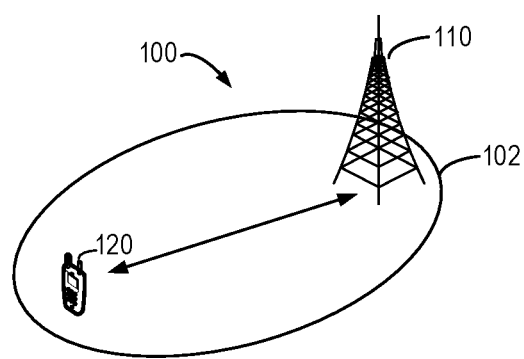
FIG. 1 illustrates an example environment in which example embodiments of the present disclosure can be implemented.

Principle of the present disclosure will now be described with reference to some example embodiments. It is to be understood that these embodiments are described only for the purpose of illustration and help those skilled in the art to understand and implement the present disclosure, without suggesting any limitation as to the scope of the disclosure. The disclosure described herein can be implemented in various manners other than the ones described below.

In the following description and claims, unless defined otherwise, all technical and scientific terms used herein have the same meaning as commonly understood by one of ordinary skills in the art to which this disclosure belongs.

References in the present disclosure to "one embodiment," "an embodiment," "an example embodiment," and the like indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an example embodiment, it is submitted that it is within the knowledge of one skilled in the art to affect such feature, structure, or characteristic in connection with other embodiments whether or not explicitly described.

It shall be understood that although the terms "first" and "second" etc. may be used herein to describe various elements, these elements should not be limited by these terms. These terms are only used to distinguish functionalities of various elements. As used herein, the term "and/or" includes any and all combinations of one or more of the listed terms.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

As used in this application, the term "circuitry" may refer to one or more or all of the following:
  (a) hardware-only circuit implementations (such as implementations in only analog and/or digital circuitry) and
  (b) combinations of hardware circuits and software, such as (as applicable):
    (i) a combination of analog and/or digital hardware circuit(s) with software/firmware and
    (ii) any portions of hardware processor(s) with software (including digital signal processor(s)), software, and memory(ies) that work together to cause an apparatus, such as a mobile phone or server, to perform various functions) and
  (c) hardware circuit(s) and or processor(s), such as a microprocessor(s) or a portion of a microprocessor(s), that requires software (e.g., firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

As used herein, the term "communication network" refers to a network following any suitable communication standards, such as fifth generation (5G) systems, Long Term Evolution (LTE), LTE-Advanced (LTE-A), Wideband Code Division Multiple Access (WCDMA), High-Speed Packet Access (HSPA), Narrow Band Internet of Things (NB-IoT) and so on. Furthermore, the communications between a terminal device and a network device in the communication network may be performed according to any suitable generation communication protocols, including, but not limited to, the first generation (1G), the second generation (2G), 2.5G, 2.75G, the third generation (3G), the fourth generation (4G), 4.5G, the future fifth generation (5G) new radio (NR) communication protocols, and/or any other protocols either currently known or to be developed in the future. Embodiments of the present disclosure may be applied in various communication systems. Given the rapid development in communications, there will of course also be future type communication technologies and systems with which the present disclosure may be embodied. It should not be seen as limiting the scope of the present disclosure to only the aforementioned system.

As used herein, the term "network device" refers to a node in a communication network via which a terminal device accesses the network and receives services therefrom. The network device may refer to a base station (BS) or an access point (AP), for example, a node B (NodeB or NB), an evolved NodeB (eNodeB or eNB), a NR Next Generation NodeB (gNB), a Remote Radio Unit (RRU), a radio header (RH), a remote radio head (RRH), a relay, a low power node such as a femto, a pico, and so forth, depending on the applied terminology and technology. An RAN split architecture comprises a gNB-CU (Centralized unit, hosting RRC, SDAP and PDCP) controlling a plurality of gNB-DUs (Distributed unit, hosting RLC, MAC and PHY). A relay node may correspond to DU part of the IAB node.

The term "terminal device" refers to any end device that may be capable of wireless communication. By way of example rather than limitation, a terminal device may also be referred to as a communication device, user equipment (UE), a Subscriber Station (SS), a Portable Subscriber Station, a Mobile Station (MS), or an Access Terminal (AT). The terminal device may include, but not limited to, a mobile phone, a cellular phone, a smart phone, voice over IP (VoIP) phones, wireless local loop phones, a tablet, a wearable terminal device, a personal digital assistant (PDA), portable computers, desktop computer, image capture terminal devices such as digital cameras, gaming terminal devices, music storage and playback appliances, vehicle-mounted wireless terminal devices, wireless endpoints, mobile stations, laptop-embedded equipment (LEE), laptop-mounted equipment (LME), USB dongles, smart devices, wireless customer-premises equipment (CPE), an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. The terminal device may also correspond to Mobile Termination (MT) part of the integrated access and backhaul (IAB) node (a.k.a. a relay node). In the following description, the terms "terminal device", "communication device", "terminal", "user equipment" and "UE" may be used interchangeably.

Although functionalities described herein can be performed, in various example embodiments, in a fixed and/or a wireless network node, in other example embodiments, functionalities may be implemented in a user equipment apparatus (such as a cell phone or tablet computer or laptop computer or desktop computer or mobile IoT device or fixed IoT device). This user equipment apparatus can, for example, be furnished with corresponding capabilities as described in connection with the fixed and/or the wireless network node(s), as appropriate. The user equipment apparatus may be the user equipment and/or or a control device, such as a chipset or processor, configured to control the user equipment when installed therein. Examples of such functionalities include the bootstrapping server function and/or the home subscriber server, which may be implemented in the user equipment apparatus by providing the user equipment apparatus with software configured to cause the user equipment apparatus to perform from the point of view of these functions/nodes.

FIG. 1 shows an example communication network 100 in which embodiments of the present disclosure can be implemented. As shown in FIG. 1, the communication network 100 comprises a receiving device 110 (hereafter also referred to as a first device 110 or a network device 110) and a transmitting device 120 (hereafter also referred to as a second device 120 or a terminal device 120). The transmitting device 120 may communicate with the receiving device 110. It is to be understood that the number of network devices and terminal devices shown in FIG. 1 is given for the purpose of illustration without suggesting any limitations. The communication network 100 may include any suitable number of network devices and terminal devices. Furthermore, it is to be understood that the receiving device may also be referred to the terminal device 120 and the transmitting device may also be referred to as the network device 110.

Depending on the communication technologies, the network 100 may be a Code Division Multiple Access (CDMA) network, a Time Division Multiple Address (TDMA) network, a Frequency Division Multiple Access (FDMA) network, an Orthogonal Frequency-Division Multiple Access (OFDMA) network, a Single Carrier-Frequency Division Multiple Access (SC-FDMA) network or any others. Communications discussed in the network 100 may conform to any suitable standards including, but not limited to, New Radio Access (NR), Long Term Evolution (LTE), LTE-Evolution, LTE-Advanced (LTE-A), Wideband Code Division Multiple Access (WCDMA), Code Division Multiple Access (CDMA), cdma2000, and Global System for Mobile Communications (GSM) and the like. Furthermore, the communications may be performed according to any generation communication protocols either currently known or to be developed in the future. Examples of the communication protocols include, but not limited to, the first generation (1G), the second generation (2G), 2.5G, 2.75G, the third generation (3G), the fourth generation (4G), 4.5G, the fifth generation (5G) communication protocols. The techniques described herein may be used for the wireless networks and radio technologies mentioned above as well as other wireless networks and radio technologies. For clarity, certain aspects of the techniques are described below for LTE, and LTE terminology is used in much of the description below.

As described above, in Release 15 standard specification, it has been agreed that RM code and Polar code are used in 5G NR to protect uplink and downlink control signaling at physical layer.

At the receiver side, the most powerful way to perform Polar decoding is the Cycle Redundant Check assisted Successive Cancellation List (CRC-SCL) decoding. It usually uses path metric (PM) as the metric to maintain multiple survival paths during decoding process. And in last step, CRC is employed to down-select the best path from multiple candidates.

Relying on CRC, the most-likely hypothesis can be determined from multiple choices. The strength of CRC will influence the final decoding performance. According to Release 15 specification, for downlink, the length of CRC is 24, such CRC is sufficiently robust. However, uplink is more problematic. For uplink payload size larger than 12 bits, Polar code with 6 CRC bits is used, whereas RM code is used for payload size smaller than 12 bits.

Typically, the CRC assisted SCL with list size $8=2^3$ consumes 3 CRC bits during the decoding so as to guide the path currently going is correct and eliminate incorrect paths. The choice of list size 8 is absolutely insufficient for hyper critical communication systems, which generally target at 6-8 nines, i.e. 99.9999%-99.999999%. In this situation, there should be less than 3 bits of CRC for verification purpose in last step of decoding. A 3-bit long CRC is extremely weak in terms of robustness and correctness.

In addition to check the correctness of the decoding path, it is possible that partial CRC bits are devoted for different purposes, e.g. tree-pruning, i.e. performing CRC check during the traversal of binary tree so that some paths having very small probabilities to be correct can be pruned. This will save some complexities. As a consequence, the number of CRC bits used in 'final check' will be less than 6 bits.

Last but not the least, according to the information from the industrial partners, the size of payload generated from industrial machinery is generally not larger than 20 bits, excluding CRC.

Therefore, the embodiments in accordance with the present disclosure propose an enhanced decoding for polarization code, i.e. Decision Feedback Successive Cancellation List (DF-SCL) decoding scheme, especially for the RM code and the Polar code. In this way, the decoding at receiver side can be enhanced to less rely on CRC during decoding to ensure the decoding path is correct, all 6 bits CR can be dedicated for final decision making for choosing the decoding path. This could, for example, dramatically improve the overall performance of uplink control channel. It should be understood that the solution of the present disclosure is not limited to be used for the uplink control channel.

Figure 2:
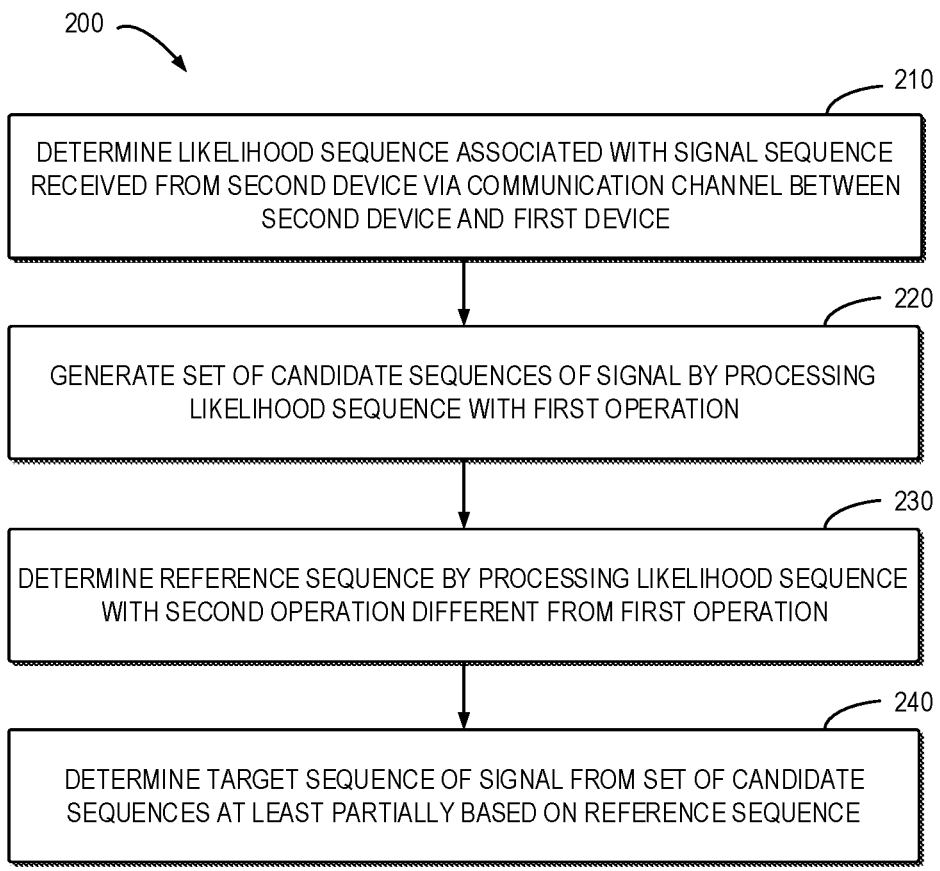
FIG. 2 shows a flowchart of an example method of enhanced decoding for polarization code according to some example embodiments of the present disclosure.

Principle and implementations of the present disclosure will be described in detail below with reference to FIGS. 2 to 4. FIG. 2 shows a flowchart of an example method 200 of enhanced decoding according to some example embodiments of the present disclosure. The method 200 can be implemented at the receiving device 110 as shown in FIG. 1. For the purpose of discussion, the method 200 will be described with reference to FIG. 1.

In a transmission of a signal sequence from the transmitting device 120 to the receiving device 110, the signal sequence should be encoded based on the specific coding pattern before the transmission to avoid the security risk during the transmission. When the receiving device 110 receives the encoded signal sequence, the receiving device 110 should decode the encoded signal sequence, to obtain the original signal sequence.

For decoding the encoded signal sequence, at 210, as shown in FIG. 2, the receiving device 110 determines a likelihood sequence associated with a signal sequence received from a transmitting device 120 via a communication channel between the receiving device 110 and the transmitting device 120.

At the receiving device 110, the encoded analog signal sequence received by antenna is first going through sampling and frequency conversion to baseband. An Analog to Digital Converter (ADC) transforms the continuous waveform into discrete symbols. These digital symbols are properly equalized and OFDM-demodulated. As a result, the input to baseband decoding chain is a series of Polar-encoded and digital modulated (QPSK, QAM) symbols.

This input can be firstly demodulated by a soft demodulator, the output is log-likelihood ratio (LLR) sequence denoted as y.

$$y=\{y_0,y_1,y_2,\ldots,y_{n-2},y_{n-1}\} \quad (1)$$

In the LLR sequence y, each element can be referred to a likelihood of a binary value 0 or a binary value 1 for the corresponding bit of the original signal sequence.

From here onwards, the processing will be carried out at log-domain in the form of LLR.

$$LLR = \log\frac{(u_i = 0 \mid y)}{(u_i = 1 \mid y)} = \log\frac{(u_i = 0 \mid u_{0,\ldots},y)}{(u_i = 1 \mid u_{0,\ldots},u_{i-1},y)} \quad (2)$$

The Equation (2) is the log-ratio of two conditional probabilities conditioned on the received y, vector u may be represented the hypotheses of originally transmitted bits. It is to be understood that LLR can also be defined the other way around with numerator and denominator swapped.

As an option, the sequence y can be input into a de-interleaver to reverse the effect of interleaving and a input LLR of a Polar decoder, vector z, can be obtained as below:

$$z=\{z_0,z_1,z_2,\ldots,z_{m-2},z_{m-1}\} \quad (3)$$

It is to be understood that both the sequence y and z can be regarded as the likelihood sequence associated with a signal sequence received from a transmitting device 120, i.e. the input of the Polar decoder.

At 220, the receiving device 110 generates a set of candidate sequences of the signal by processing the likelihood sequence with a first operation.

In some example embodiments, the first operation may be referred to a binary tree algorithm. As described above, each element of the likelihood sequence may represent a likelihood of the binary value 1 or 0 for each bit of the original signal sequence. Based on the likelihood sequence, a binary tree can be constructed by processing each element of the likelihood sequence successively.

By traversing the binary tree, the receiving device 110 may determine a plurality of the decoding path, i.e. the path metrics. For example, there is a path metric computed for each possible path. The individual path metric may represent the likelihood of taking a particular path from one node of binary tree to another.

During the tree traversal process, new path metrics keeps being generated. A maximum number of L path metrics can be held, where L is the list size. Thus, path metrics are sorted in ascending/descending order and compared with each other, new path metrics get into the top of this list, whereas path metrics at the bottom of list may be eliminated.

This process is repeated in successive manner till the last bit. Therefore, a list containing L most promising path metrics may be obtained, which can be considered as the set of candidate sequences. That is, the receiving device 110 may determine the set of candidate sequences based on the plurality of the decoding path.

At 230, the receiving device 110 determines a reference sequence by processing the likelihood sequence with a second operation. Herein the second operation may be referred to a hard decision algorithm. The reference sequence may be generated by processing each element of the likelihood sequence with a predetermined pattern of the hard decision algorithm.

For example, a decision value can be predetermined. Based on the decision value, a first group of elements and a second group of elements may be determined from the likelihood sequence. For example, each element of the first group of elements may have a value exceeding the decision value and each element of the second group of elements may have a value being lower than the decision value. Then the values of the first group of elements can be binarized to be a first group of bits and the value of the second group of the elements can be binarized to be a first second of bits. For example, if the decision value is zero, it can be defined that the elements in the likelihood sequence having a value exceeding zero are binarized to be 1, and the other elements in the likelihood sequence having a value being lower than zero are binarized to be 0, which can be represented mathematically in Equation (4) as below:

$$v_i = \begin{cases} 0, & y_i < 0 \\ 1, & y_i \geq 0 \end{cases} \quad (4)$$

wherein $y_i$ may be represented as the $i^{th}$ element in the likelihood sequence y in the Equation (1) and $v_i$ may be represented as the $i^{th}$ element in a bit sequence v generated by processing the likelihood sequence y with a hard decision algorithm.

An another option, for example, if the decision value is zero, it can be defined that the elements in the likelihood sequence having a value exceeding zero are binarized to be 0, and the other elements in the likelihood sequence having a value being lower than zero are binarized to be 1, which can be represented mathematically in Equation (5) as below:

$$v_i = \begin{cases} 1, & y_i < 0 \\ 0, & y_i \geq 0 \end{cases} \quad (5)$$

similarly, wherein $y_i$ may be represented as the $i^{th}$ element in the likelihood sequence y in the Equation (1) and $v_i$ may be represented as the $i^{th}$ element in a bit sequence v generated by processing the likelihood sequence y with a hard decision algorithm.

Then the receiving device 110 may determine the reference sequence based on the first group of bits and the second group of bits. That is, the new bit sequence v generated by processing the likelihood sequence y with a hard decision algorithm can be read as:

$$v=\{v_0,v_1,v_2,\ldots,v_{m-2},v_{m-1}\} \quad (6)$$

Referring back to FIG. 2, at 240, the receiving device 110 determines a target sequence of the signal from the set of candidate sequences at least partially based on the reference sequence. Hereinafter the target sequence of the signal may be referred to the final decoding signal sequence, i.e. the original signal sequence before encoding.

As mentioned above, the CRC may be used for checking which decoding path is correct in a decoding procedure. For example, all CRC bits may be used for the final check to choose a final decoding signal sequence from a list of decoding paths. As another option, it is also possible that, the path determination, including the final step of selecting the most-likely from the set of candidate sequences, is made to be fully relying on the proposed path metric. Hence, it is possible to use none of CRC bits for path determination. Instead, partial of implemented CRC can be used for further error correction to improve the BLER performance.

Figure 3:
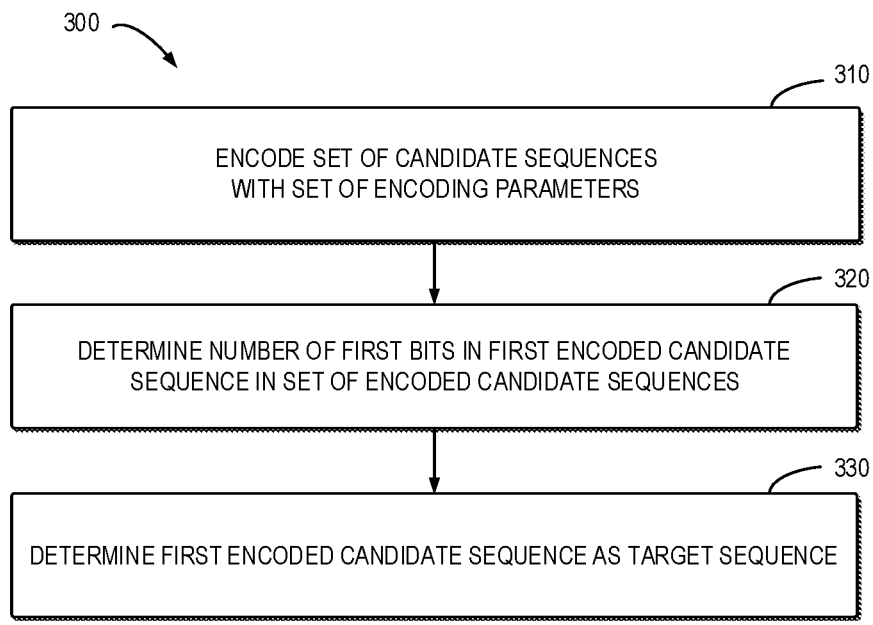
FIG. 3 shows a flowchart of an example method of Enhanced decoding for polarization code according to some example embodiments of the present disclosure.
Figure 4:
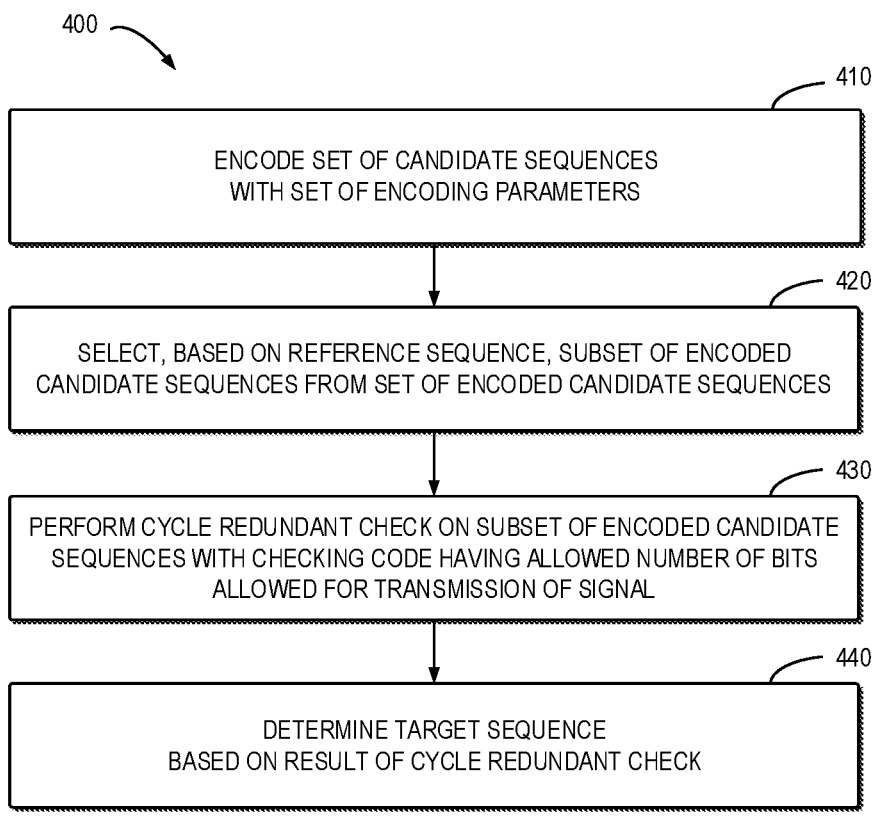
FIG. 4 shows a flowchart of an example method of Enhanced decoding for polarization code according to some example embodiments of the present disclosure.

With reference to FIGS. 3-4, the procedure for determining the target sequence from the set of candidate sequences can be further described in detail.

FIG. 3 shows a flowchart of an example method 300 of enhanced decoding according to some example embodiments of the present disclosure. The method 300 can be implemented at the receiving device 110 as shown in FIG. 1. For the purpose of discussion, the method 300 will be described with reference to FIG. 1.

At 310, the receiving device 110 may encode the set of candidate sequences with a set of encoding parameters. The set of the encoding parameters are used for encoding the signal transmitted by the transmitting device 120. The set of the encoding parameters and corresponding encoding pattern may be pre-configured and known for both the receiving side and the transmitting device.

That is, for each of the set of candidate sequences, i.e. maximum number of L path metrics in the list, the receiving device 110 may re-encoding it with the encoding parameters used for encoding the signal transmitted by the transmitting device 120. One of the re-encoded bit sequence may be represent as:

$$v'=\{v_0', v_1', v_2', \ldots, v_{m-2}', v_{m-1}'\} \quad (6)$$

For each of the re-encoded bit sequences in the list, the receiving device 110 then may compare each bit of a re-encoded bit sequence with the corresponding bit of the reference sequence, i.e. the bit sequence v, which is generated by processing the likelihood sequence y with a hard decision algorithm, as described above. For example, if the re-encoded bit sequence is v' shown in the Equation (6), the first bit $v_0'$ in the re-encoded bit sequence v' may be compared with the first bit $v_0$ in the bit sequence v, the second bit $v_1'$ in the re-encoded bit sequence v' may be compared with the first bit $v_1$ in the bit sequence v, and so on.

As shown in FIG. 3, at 320, the receiving device 110 may determine the number of first bits in a first encoded candidate sequence in the set of encoded candidate sequences.

The first bits have values different from those of corresponding bits in the reference sequence.

In this procedure, for each of the re-encoded bit sequences, the the number of first bits in a re-encoded bit sequence having a value different from those of corresponding bits in the reference sequence may be counted. For example, if the re-encoded bit sequence is v' shown in the Equation (6) and the value of the first bit $v_0'$ in the re-encoded bit sequence v' does not equal to the value of the first bit $v_0$ in the bit sequence v, the counter will become 1. The number of differences is recorded as N:

$$N=\text{COUNT}\{\text{XOR}(v,v')==1\} \quad (7)$$

Until the comparison of all re-encoded bit sequences in the list with the reference sequence is completed, the receiving device 110 may determine a target sequence based on a threshold number T for the bit differences between a re-encoded bit sequence and the reference sequence.

At 330, if the receiving device 110 determines the number of the first bits is lower than a threshold number, the receiving device 110 may determine the first encoded candidate sequence as the target sequence.

For example, if the number of bit differences N between the re-encoded bit sequence and the reference sequence is lower than the threshold number T, this re-encoded bit sequence may be considered as a correct decoding path in the re-encoded candidate sequences, i.e. as the target sequence of the signal.

In the method 300 shown in FIG. 3, the CRC bits are not used for choosing the correct decoding path in the list at all. That is, the reliance on CRC is weakened or even completely eliminated in the decoding procedure at the receiving side. As described above, the CRC bits may be used for further error correction to improve the BLER performance.

In some example embodiments, the receiving device 110 may perform a cycle redundant check for the target decoded sequence with a checking code having an allowed number of bits for a transmission of the signal.

The CRC is a linear block code, a well-designed code with length of P may correct t errors:

$$t=(P-1)/2 \quad (8)$$

This error correction will be extremely beneficial for small blocks because of the limited amount of redundancy level. In this way, an additional error correction capability may be obtained, which could lead to further lower block error rate.

As described above, in some example embodiments, the CRC bits may also be used for the final check. For example, if a plurality re-encoded sequences can be selected from the candidate sequences after a bitwise comparison with the reference sequence.

FIG. 4 shows a flowchart of an example method 400 of enhanced decoding for polarization code according to some example embodiments of the present disclosure. The method 400 can be implemented at the receiving device 110 as shown in FIG. 1. For the purpose of discussion, the method 400 will be described with reference to FIG. 1.

As shown in FIG. 4, at 410, the receiving device 110 may encode the set of candidate sequences with a set of encoding parameters. The set of the encoding parameters are used for encoding the signal transmitted by the transmitting device 120. The step 410 is basically same with the step 310 shown in FIG. 3. After the re-encoding, a set of re-encoded bit sequence may be obtained and one of the re-encoded bit sequences may be represent as v' in Equation (6).

At 420, the receiving device 110 may select, based on the reference sequence, a subset of encoded candidate sequences from the set of encoded candidate sequences. The number of first bits in each encoded candidate sequence in the subset is lower than a threshold number and the first bits have values different from those of corresponding bits in the reference sequence.

Except that the receiving device 110 may determine, after the comparison of each re-encoded bit sequence with the reference sequence, multiple re-encoded bit sequences (i.e. a subset of encoded candidate sequences from the set of encoded candidate sequences) that include a number of bits N having different bit values being lower than a threshold number T, the step 420 of the method 400 is substantially same with the steps 320-330 of the method 300.

It is to be understood that the threshold number of the method 400 may be slightly greater as that of method 300. The setting of the threshold number will be discussed in the following section, so a detailed description is not provided here.

As shown in FIG. 4, at 430, the receiving device 110 may further perform a cycle redundant check on the subset of encoded candidate sequences with a checking code having an allowed number of bits allowed for a transmission of the signal and, at 440, the receiving device 110 may determine the target sequence based on a result of the cycle redundant check.

The reason behind this solution described with reference to FIGS. 2-4 can be analyzed as follows. The encoded codewords belong to a mathematical space corresponding to each information bit sequence. Then different information bit sequence would correspond to different codeword space. Thus, the codeword is a special bit sequence, other than random bit sequence because it should fall into a specific space. The hard-decided bit sequence corresponding to the demodulated symbols comes from a codeword and it should belong to certain space. The smaller number of differences the better it falls into a space. If the number of differences is more than a threshold, it means the received block is contaminated and does not belong to any space, so it is erroneously decoded.

Figure 5A:
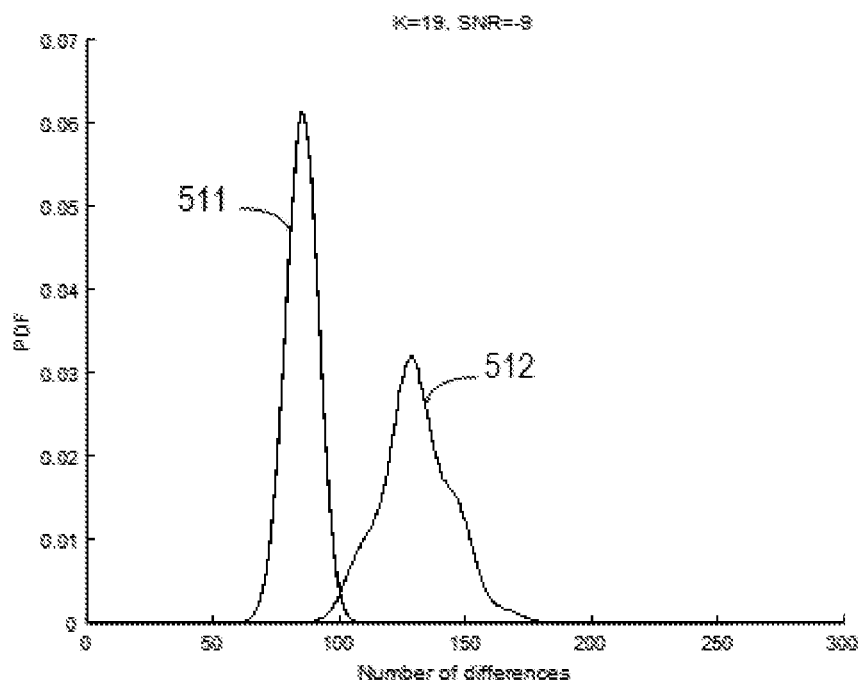
FIGS. 5A-5B shows results of simulations according the embodiments of the present disclosure.
Figure 5B:
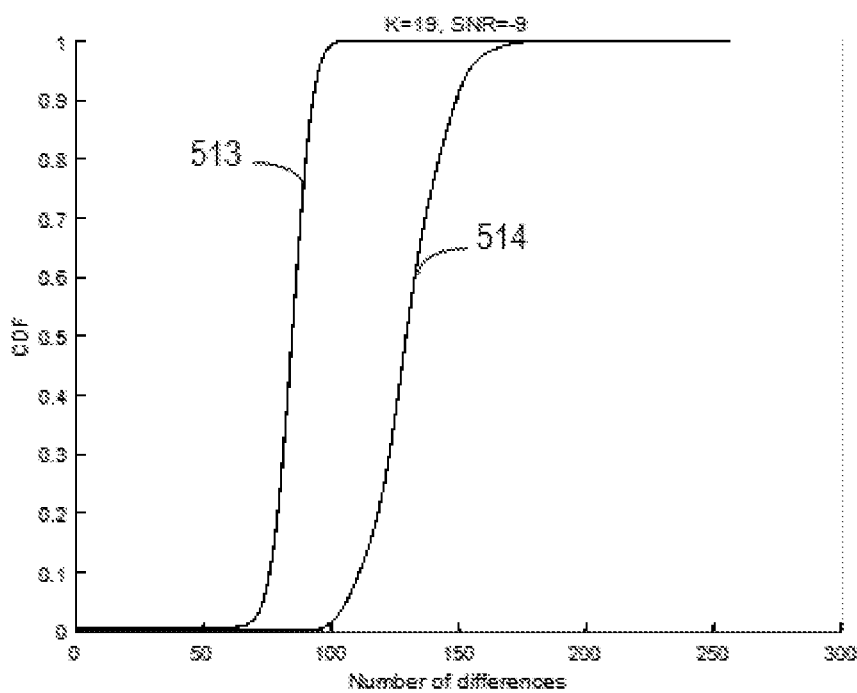

According to extensive simulations, the capability of distinguishing the correct blocks against incorrect blocks is examined. For the payload size K=12 to K=19 and multiple SNRs, the multiple checks are preformed and these blocks are encoded by Polar code. FIGS. 5A-5B shows results of simulations according the embodiments of the present disclosure. FIG. 5A, with a Probability Distribution Function (PDF) figure, shows the distribution of the number of differences, i.e. the new metric descried above, of the correct blocks (curve 511) and incorrect blocks (curve 512). It can be seen that they are very distinct and can be separated very well. FIG. 5B, with a Cumulative Distribution Function (CDF) figure, shows its performance with curve 513 and 514, respectively. As shown in FIGS. 5A-5B, for example, for K=19, SNR=−9, if the threshold number is set to be T=101 (a mathematical way to determine T is given later), if N<T=101, the block is considered to be correct, and otherwise incorrect. In this case, almost 100% correct can be decided to be correct, and almost 97% incorrect blocks can be found to be incorrect, meaning a very stable performance.

Thus, the probability density of performing a correct decoding with respect to various number of differences between the reference bit sequence v and the encoded candidate bit sequence v' can be formulated as:

$$\frac{1}{\sigma\sqrt{2\pi}}\exp\left(-\frac{(N-\mu)^2}{2\sigma^2}\right) \quad (9)$$

where μ=80, σ=7.

In some example embodiments, the threshold number T may be defined as 3 standard deviation of the mean, i.e. 3-sigma rule, μ+3σ=101. In some example embodiments, it might be possible, a same T is used for all payload size, SNR, i.e. fixed threshold. It is also possible in another case to configure threshold T dynamically.

Figure 6:
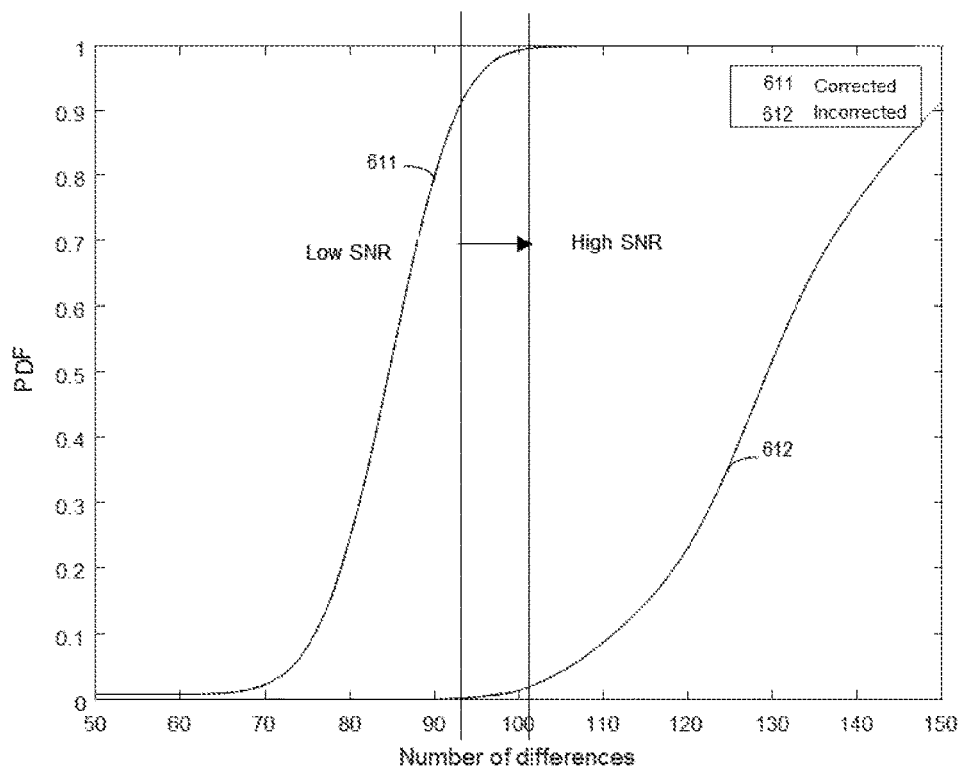
FIG. 6 shows an example of the SNR dependent threshold number according the embodiments of the present disclosure.

For example, the configuration of the threshold T may be considered jointly with SNR to dynamically balance the sensitivity of the new metric used in DF-SCL and block error rate. For low SNR, a lower threshold may be configured to suppress the erroneous decision incurred during DF-SCL decoding. For higher SNR, a higher threshold could be used to reduce the block error rate. FIG. 6 shows an example of the SNR dependent threshold number. In this case, threshold T might be configured in the range of 2 standard deviation of the mean (μ+2σ=94) and 3 standard deviation of the mean (101) as illustrated in the FIG. 6.

Figure 7:
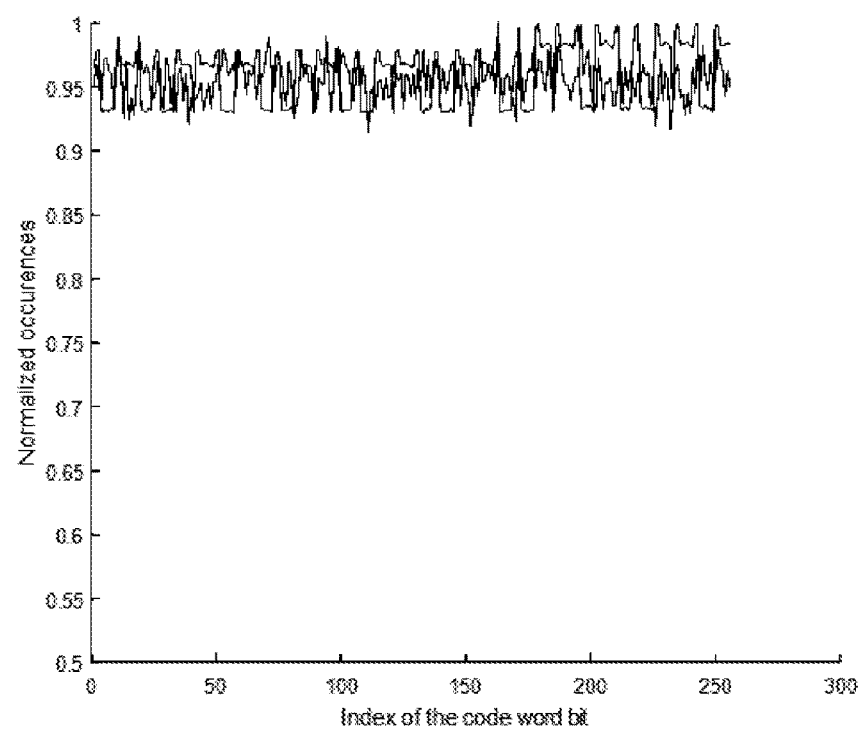
FIG. 7 shows an example of the difference distribution among the coded bit sequence according the embodiments of the present disclosure.

Furthermore, an improvement is made to reduce the complexity. FIG. 7 shows an example of the difference distribution among the coded bit sequence, i.e. the codeword. There are 256 coded bits, and any bit may have similar probability of such differences, though some shows a little bit higher probability. This means it is possible to do sampling from the demodulated symbols and/or the re-encoded bits to reduce the computing complexity. For example, only ⅕ bits are used to calculate the said differences. This would result in similar detection performance. It might also possible to select part of the bits with more similar difference probabilities, or select different segments of the bit sequences, or other statistics out of the bit sequences, e.g. by merging part of the bit sequences.

Figure 8:
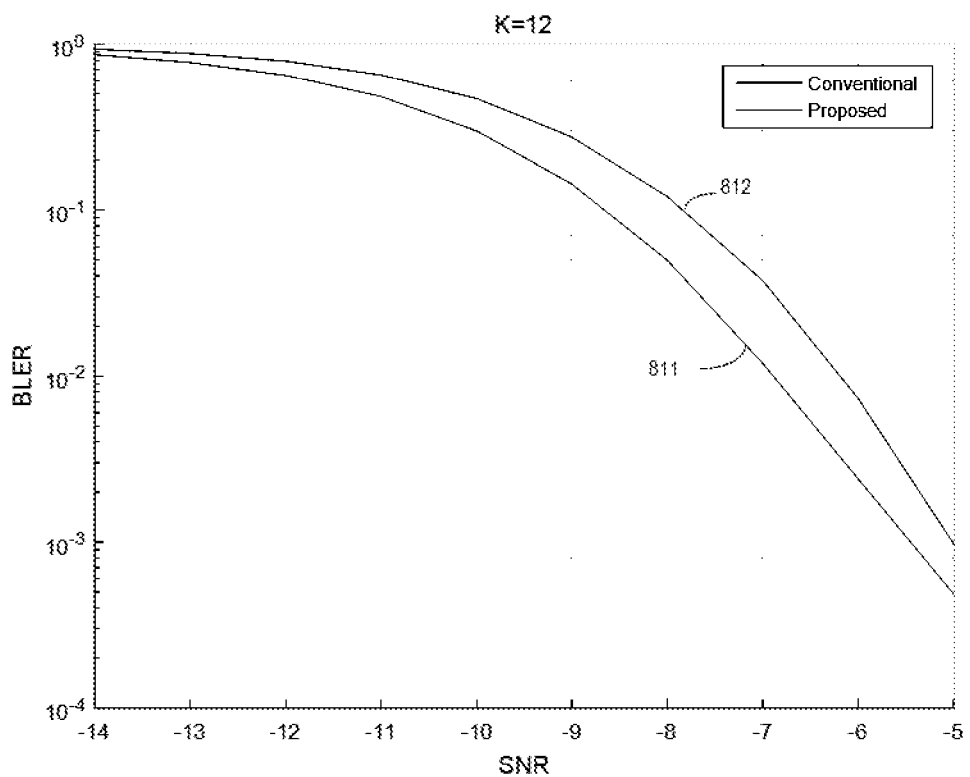
FIG. 8 shows the BLER performance corresponding to the step that using CRC bits to correct up to 2 errors with fixed threshold T according the embodiments of the present disclosure.

Now the improvement can be shown quantitatively. The measurement is in the form of block error rate (BLER), the most crucial performance indicator for the evaluation of coding scheme. FIG. 8 shows the BLER performance corresponding to the step that using CRC bits to correct up to 2 errors with fixed threshold T. It can be seen that, when payload size K=12, the solution of the present disclosure can improve the performance more than 0.5 dB at 1% BLER and almost 1.0 dB at 0.1% BLER, wherein the curve 811 shows the BLER performance obtained by the solution of the present disclosure, while the curve 812 shows the BLER performance obtained by a conventional way. Considering the fact that Release 15 Polar code is less than 2 dB away from the ultimate Shannon bound, that new scheme may achieve significant technical gain.

The solution of the present disclosure allows all CRC bits being devoted to final check, i.e. select the best path out of all candidate paths. The proposed scheme considers partial or full differences between the hard decision of the demodulated LLRs and the re-encoding of decoded bits. In this way, the decoding at receiver side can be enhanced to less rely on CRC during decoding. This could dramatically improve the overall performance of the channel. Meanwhile, since RM code and Polar code belong to the same code family, thus the decoding method proposed in the present disclosure may be used to decode both of them. This also means that the enhancement to improve one code will also benefit the other.

In some example embodiments, an apparatus capable of performing the method 200 (for example, implemented at the receiving device 110) may comprise means for performing the respective steps of the method 200. The means may be implemented in any suitable form. For example, the means may be implemented in a circuitry or software module.

In some example embodiments, the apparatus comprises means for determining a likelihood sequence associated with a signal sequence received from a second device via a communication channel between the second device and the first device; means for generating a set of candidate sequences of the signal by processing the likelihood sequence with a first operation; means for determining a reference sequence by processing the likelihood sequence with a second operation different from the first operation;

and means for determining a target sequence of the signal from the set of candidate sequences at least partially based on the reference sequence.

In some example embodiments, the means for determining the likelihood sequence may comprise means for receiving an encoded sequence of the signal from the second device; and means for determining the likelihood sequence based on a demodulation of the encoded sequence.

In some example embodiments, the means for determining the set of candidate sequences may comprise means for constructing a binary tree associated with the likelihood sequence based on the first operation; means for determining a plurality of decoding paths for the signal by performing a traversal procedure of the binary tree; and means for determining the set of candidate sequences based on the plurality of decoding paths.

In some example embodiments, the means for determining the reference sequence may comprise means for determining, from the likelihood sequence, a first group of elements and a second group of elements based on a decision value for the second operation, each element in the first group having a value exceeding the decision value, each element in the second group having a value being lower than the decision value; means for binarizing values of the first group of elements to be a first group of bits; means for binarizing values of the second group of elements to be a second group of bits different from the first group of bits; and means for determining the reference sequence based on the first group of bits and the second group of bits.

In some example embodiments, the means for determining the target decoded sequence may comprise means for encoding the set of candidate sequences with a set of encoding parameters, the set of the encoding parameters being used for encoding the signal transmitted by the second device; means for determining the number of first bits in a first encoded candidate sequence in the set of encoded candidate sequences, the first bits having values different from those of corresponding bits in the reference sequence; and means for determine a target sequence of the signal from the set of candidate sequences at least partially based on the reference sequence.

In some example embodiments, the apertures may comprise means for performing a cycle redundant check for the target sequence with a checking code having an allowed number of bits for a transmission of the signal.

In some example embodiments, the means for determining the target decoded sequence may comprise means for encoding the set of candidate sequences with a set of encoding parameters, the set of encoding parameters being used for encoding the signal transmitted by the second device; means for selecting, based on the reference sequence, a subset of encoded candidate sequences from the set of encoded candidate sequences, the number of first bits in each encoded candidate sequence in the subset being lower than a threshold number, the first bits having values different from those of corresponding bits in the reference sequence; means for performing a cycle redundant check on the subset of encoded candidate sequences with a checking code having an allowed number of bits allowed for a transmission of the signal; and means for determining the target sequence based on a result of the cycle redundant check.

Figure 9:
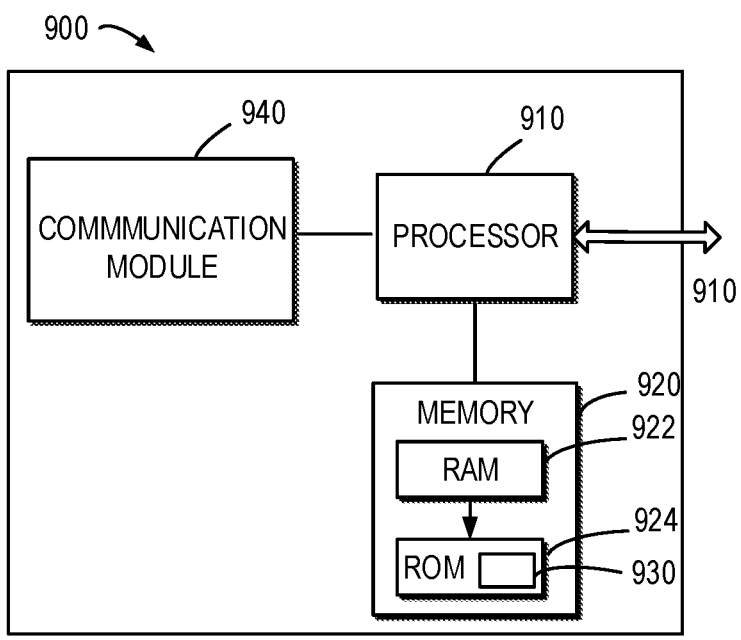
FIG. 9 shows a simplified block diagram of a device that is suitable for implementing example embodiments of the present disclosure.

FIG. 9 is a simplified block diagram of a device 900 that is suitable for implementing embodiments of the present disclosure. The device 900 may be provided to implement the communication device, for example the receiving device 110 as shown in FIG. 1. As shown, the device 900 includes one or more processors 910, one or more memories 940 coupled to the processor 910, and one or more transmitters and/or receivers (TX/RX) 940 coupled to the processor 910.

The TX/RX 940 is for bidirectional communications. The TX/RX 940 has at least one antenna to facilitate communication. The communication interface may represent any interface that is necessary for communication with other network elements.

The processor 910 may be of any type suitable to the local technical network and may include one or more of the following: general purpose computers, special purpose computers, microprocessors, digital signal processors (DSPs) and processors based on multicore processor architecture, as non-limiting examples. The device 900 may have multiple processors, such as an application specific integrated circuit chip that is slaved in time to a clock which synchronizes the main processor.

The memory 920 may include one or more non-volatile memories and one or more volatile memories. Examples of the non-volatile memories include, but are not limited to, a Read Only Memory (ROM) 924, an electrically programmable read only memory (EPROM), a flash memory, a hard disk, a compact disc (CD), a digital video disk (DVD), and other magnetic storage and/or optical storage. Examples of the volatile memories include, but are not limited to, a random access memory (RAM) 922 and other volatile memories that will not last in the power-down duration.

A computer program 930 includes computer executable instructions that are executed by the associated processor 910. The program 930 may be stored in the ROM 920. The processor 910 may perform any suitable actions and processing by loading the program 930 into the RAM 920.

The embodiments of the present disclosure may be implemented by means of the program 930 so that the device 900 may perform any process of the disclosure as discussed with reference to FIGS. 2-4. The embodiments of the present disclosure may also be implemented by hardware or by a combination of software and hardware.

Figure 10:
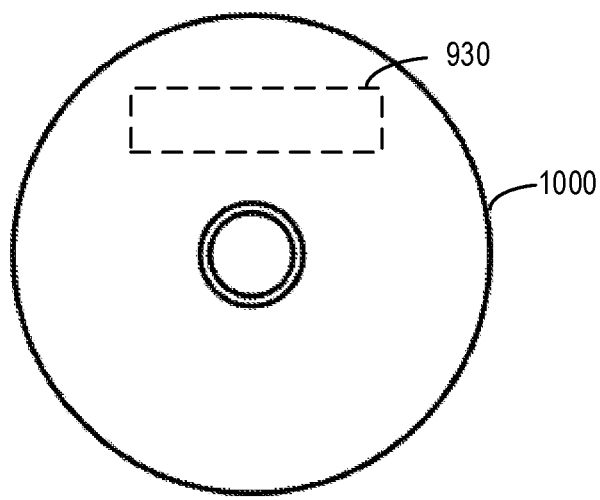
FIG. 10 shows a block diagram of an example computer readable medium in accordance with some embodiments of the present disclosure.

In some embodiments, the program 930 may be tangibly contained in a computer readable medium which may be included in the device 900 (such as in the memory 920) or other storage devices that are accessible by the device 900. The device 900 may load the program 930 from the computer readable medium to the RAM 922 for execution. The computer readable medium may include any types of tangible non-volatile storage, such as ROM, EPROM, a flash memory, a hard disk, CD, DVD, and the like. FIG. 10 shows an example of the computer readable medium 1000 in form of CD or DVD. The computer readable medium has the program 930 stored thereon.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representations, it is to be understood that the block, device, system, technique or method described herein may be implemented in, as non-limiting examples, hardware, software, firmware, special purpose circuits or logic, general purpose hardware or controller or other computing devices, or some combination thereof.

The present disclosure also provides at least one computer program product tangibly stored on a non-transitory computer readable storage medium. The computer program product includes computer-executable instructions, such as those included in program modules, being executed in a device on a target real or virtual processor, to carry out the methods 300 and 400 as described above with reference to FIGS. 2-4. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing device, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In the context of the present disclosure, the computer program codes or related data may be carried by any suitable carrier to enable the device, device or processor to perform various processes and operations as described above. Examples of the carrier include a signal, computer readable medium, and the like.

The computer readable medium may be a computer readable signal medium or a computer readable storage medium. A computer readable medium may include but not limited to an electronic, magnetic, optical, electromagnetic, infrared, or semiconductor system, device, or device, or any suitable combination of the foregoing. More specific examples of the computer readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in languages specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A first device comprising:
   at least one processor; and
   at least one non-transitory memory including computer program codes;
   the at least one memory and the computer program codes are configured to, with the at least one processor, cause the first device at least to:
   determine a likelihood sequence associated with a signal received from a second device via a communication channel between the second device and the first device;
   generate a set of candidate sequences of the signal by processing the likelihood sequence with a binary tree algorithm;
   determine a reference sequence by processing the likelihood sequence with a hard decision algorithm; and
   determine a target sequence of the signal from the set of candidate sequences at least partially based on the reference sequence.

2. The first device of claim 1, wherein the at least one memory and the computer program codes are configured to, with the at least one processor, cause the first device to determine the likelihood sequence with:
   receiving an encoded sequence of the signal from the second device; and
   determining the likelihood sequence based on a demodulation of the encoded sequence.

3. The first device of claim 1, wherein the at least one memory and the computer program codes are configured to, with the at least one processor, cause the first device to determine the set of candidate sequences with:
   constructing a binary tree associated with the likelihood sequence based on the binary tree algorithm;
   determining a plurality of decoding paths for the signal with performing a traversal procedure of the binary tree; and
   determining the set of candidate sequences based on the plurality of decoding paths.

4. The first device of claim 1, wherein the at least one memory and the computer program codes are configured to, with the at least one processor, cause the first device to determine the reference sequence with:
   determining, from the likelihood sequence, a first group of elements and a second group of elements based on a decision value for the hard decision algorithm, each element in the first group having a value exceeding the decision value, each element in the second group having a value being lower than the decision value;
   binarizing values of the first group of elements to be a first group of bits;
   binarizing values of the second group of elements to be a second group of bits different from the first group of bits; and
   determining the reference sequence based on the first group of bits and the second group of bits.

5. The first device of claim 1, wherein the at least one memory and the computer program codes are configured to, with the at least one processor, cause the first device to determine the target decoded sequence with:

encoding the set of candidate sequences with a set of encoding parameters, the set of the encoding parameters being used for encoding the signal transmitted by the second device;

determining the number of first bits in a first encoded candidate sequence in the set of encoded candidate sequences, the first bits having values different from those of corresponding bits in the reference sequence; and in accordance with a determination that the number of the first bits is lower than a threshold number, determine the first encoded candidate sequence as the target sequence.

6. The first device of claim 1, wherein the at least one memory and the computer program codes are configured to, with the at least one processor, cause the first device to:

perform a cycle redundant check for the target sequence with a checking code having an allowed number of bits for a transmission of the signal.

7. The first device of claim 1, wherein the at least one memory and the computer program codes are configured to, with the at least one processor, cause the first device to determine the target decoded sequence with:

encoding the set of candidate sequences with a set of encoding parameters, the set of encoding parameters being used for encoding the signal transmitted by the second device;

selecting, based on the reference sequence, a subset of encoded candidate sequences from the set of encoded candidate sequences, the number of first bits in each encoded candidate sequence in the subset being lower than a threshold number, the first bits having values different from those of corresponding bits in the reference sequence;

performing a cycle redundant check on the subset of encoded candidate sequences with a checking code having an allowed number of bits allowed for a transmission of the signal; and determining the target sequence based on a result of the cycle redundant check.

8. The first device of claim 1, wherein the first device comprises a receiving device and the second device comprises a transmitting device.

9. A method comprising:

determining a likelihood sequence associated with a signal received from a second device via a communication channel between the second device and the first device;

generating a set of candidate sequences of the signal by processing the likelihood sequence with a binary tree algorithm;

determining a reference sequence by processing the likelihood sequence with a hard decision algorithm; and determining a target sequence of the signal from the set of candidate sequences at least partially based on the reference sequence.

10. The method of claim 9, wherein determining the likelihood sequence comprises:

receiving an encoded sequence of the signal from the second device; and determining the likelihood sequence based on a demodulation of the encoded sequence.

11. The method of claim 9, wherein determining the set of candidate sequences comprises:

constructing a binary tree associated with the likelihood sequence based on the binary tree algorithm;

determining a plurality of decoding paths for the signal with performing a traversal procedure of the binary tree; and determining the set of candidate sequences based on the plurality of decoding paths.

12. The method of claim 9, wherein determining the reference sequence comprises:

determining, from the likelihood sequence, a first group of elements and a second group of elements based on a decision value for the hard decision algorithm, each element in the first group having a value exceeding the decision value, each element in the second group having a value being lower than the decision value;

binarizing values of the first group of elements to be a first group of bits;

binarizing values of the second group of elements to be a second group of bits different from the first group of bits; and determining the reference sequence based on the first group of bits and the second group of bits.

13. The method of claim 9, wherein determining the determining the target decoded sequence comprises:

encoding the set of candidate sequences with a set of encoding parameters, the set of encoding parameters being used for encoding the signal transmitted with the second device;

determining the number of first bits in a first encoded candidate sequence in the set of encoded candidate sequences, the first bits having values different from those of corresponding bits in the reference sequence; and in accordance with a determination that the number of the first bits is lower than a threshold number, determine the first encoded candidate sequence as the target sequence.

14. The method of claim 9, further comprising:

performing a cycle redundant check for the target sequence with a checking code having an allowed number of bits for a transmission of the signal.

15. The method of claim 9, wherein determining the determining the target decoded sequence comprises:

encoding the set of candidate sequences with a set of encoding parameters, the set of encoding parameters being used for encoding the signal transmitted by the second device;

selecting, based on the reference sequence, a subset of encoded candidate sequences from the set of encoded candidate sequences, the number of first bits in each encoded candidate sequence in the subset being lower than a threshold number, the first bits having values different from those of corresponding bits in the reference sequence;

performing a cycle redundant check on the subset of encoded candidate sequences with a checking code having an allowed number of bits allowed for a transmission of the signal; and determining the target sequence based on a result of the cycle redundant check.

16. The method of claim 9, wherein the first device comprises a receiving device and the second device comprises a transmitting device.

17. A non-transitory computer readable medium comprising program instructions that, when executed, cause an apparatus to perform at least:

determining a likelihood sequence associated with a signal received from a second device via a communication channel between the second device and the first device;

generating a set of candidate sequences of the signal by processing the likelihood sequence with a binary tree algorithm;

determining a reference sequence by processing the likelihood sequence with a hard decision algorithm; and determining a target sequence of the signal from the set of candidate sequences at least partially based on the reference sequence.

* * * * *